US012518946B2

(12) United States Patent
Leavitt et al.

(10) Patent No.: US 12,518,946 B2
(45) Date of Patent: Jan. 6, 2026

(54) INTEGRATED GAS BOX AND ION SOURCE

(71) Applicant: Applied Materials, Inc., Santa Clara, CA (US)

(72) Inventors: William H. Leavitt, Haverhill, MA (US); Shengwu Chang, South Hamilton, MA (US); William H. Park, Jr., Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 410 days.

(21) Appl. No.: 18/210,884

(22) Filed: Jun. 16, 2023

(65) Prior Publication Data

US 2024/0420920 A1 Dec. 19, 2024

(51) Int. Cl.
*H01J 37/317* (2006.01)
*H01J 37/08* (2006.01)
*H01J 37/32* (2006.01)

(52) U.S. Cl.
CPC .......... *H01J 37/3171* (2013.01); *H01J 37/08* (2013.01); *H01J 37/3244* (2013.01)

(58) Field of Classification Search
CPC ..... H01J 37/3244; H01J 37/08; H01J 37/3171
See application file for complete search history.

(56) References Cited

U.S. PATENT DOCUMENTS 11,587,778 B2 * 2/2023 Likhanskii ............ H01J 49/105
2003/0045098 A1 3/2003 Verhaverbeke et al.
2007/0210260 A1 * 9/2007 Horsky ................ C23C 14/564 250/424
2008/0124903 A1 5/2008 England et al.
2008/0135783 A1 6/2008 Buonodono et al.
2010/0108915 A1 5/2010 Becker et al.
2014/0291554 A1 10/2014 Jerez et al.
(Continued)

FOREIGN PATENT DOCUMENTS

JP 10-106478 A 4/1998
JP 2017-130404 A 7/2017
(Continued)

OTHER PUBLICATIONS

International Search Report and Written Opinion mailed Sep. 9, 2024 in corresponding PCT application No. PCT/US2024/029424.
(Continued)

*Primary Examiner* — Patrick C Chen
(74) *Attorney, Agent, or Firm* — Nields, Lemack & Frame, LLC

(57) ABSTRACT

An integrated gas box is disclosed. The integrated gas box is an enclosure, wherein one wall of the enclosure includes an aperture. A bushing is affixed to the exterior of this wall. The distal end of the bushing has a flange that is affixed to a wall of the vacuum chamber. The ion source is introduced into the bushing through an access door in the enclosure and slides into the aperture. The base flange of the ion source is sufficiently large such that it cannot pass through the aperture and forms a seal between the bushing and the interior of the integrated gas box. The integrated gas box includes the gas canisters and associated valves which are used to supply feed gas and diluent gasses to the ion source. The integrated gas box also houses the power supplies used to bias the components within the ion source.

18 Claims, 6 Drawing Sheets

(56) References Cited

U.S. PATENT DOCUMENTS

| | | | | |
|---|---|---|---|---|
| 2021/0066017 | A1* | 3/2021 | Chang | H01J 27/205 |
| 2023/0008178 | A1 | 1/2023 | Hirai et al. | |

FOREIGN PATENT DOCUMENTS

| | | | |
|---|---|---|---|
| TW | 200737290 | A | 10/2007 |
| TW | 200830383 | A | 7/2008 |

OTHER PUBLICATIONS

High Voltage Engineering Europe B.V., Singletron Accelerator Systems: Coaxial and In-line Positive Ion Accelerators. 6 pages, 2013.

* cited by examiner

INTEGRATED GAS BOX AND ION SOURCE

FIELD

Embodiments of the present disclosure relate to an integrated gas box, and more particularly a system that includes the gas canisters, power supplies and the ion source in one enclosure.

BACKGROUND

Ion implantation is a common technique to introduce impurities into a workpiece to affect the conductivity of portions of that workpiece. For example, ions that contain elements in Group III, such as boron, aluminum and gallium, may be used to create P-type regions in a silicon workpiece. Ions that contain elements in Group V, such as phosphorus and arsenic, may be used to create N-type regions in the silicon workpiece. Of course, other species may also be used.

In some ion implantation systems, ions are generated in an ion source and are extracted through an extraction aperture. In some embodiments, one or more electrodes, which are electrically biased, are located outside the ion source, proximate the extraction aperture. The voltage applied to one of these electrodes serves to attract ions from within the ion source such that the ions exit the ion source through the extraction aperture.

The ion source may be biased at a high voltage, such as tens or hundreds of kilovolts. Additionally, the power supplies that are used to bias the components within the ion source are referenced to this voltage. Traditionally, the gas canisters which are used to provide gas to the ion source, as well as the power supplies associated with the ion source, are disposed in a separate enclosure, referred to as a gas box, which is biased at the same voltage as the ion source. An umbilical cable is used to deliver the gasses, voltages and currents from the gas box to the ion source, which is separate from the gas box.

As the voltages associated with the ion source increase, so does the possibility of arcing between two components. During an arcing event, the high frequency electromagnetic field induces currents in the umbilical cable, which flow to the components in the gas box. This may cause glitches, or may permanently damage the electronic components in the gas box. This type of failure may render the ion implantation system unusable for an extended period of time while the components in the gas box are replaced.

Therefore, it would be beneficial if there were a system that reduced the likelihood of such a failure, so that the availability of the ion implantation system was not affected.

SUMMARY

An integrated gas box is disclosed. The integrated gas box is an enclosure, wherein one wall of the enclosure includes an aperture. A bushing is affixed to the exterior of this wall. The distal end of the bushing has a flange that is affixed to a wall of the vacuum chamber. The ion source is introduced into the bushing through an access door in the enclosure and slides into the aperture. The base flange of the ion source is sufficiently large such that it cannot pass through the aperture and forms a seal between the bushing and the interior of the integrated gas box. The integrated gas box includes the gas canisters and associated valves which are used to supply feed gas and diluent gasses to the ion source. The integrated gas box also houses the power supplies used to bias the components within the ion source.

According to one embodiment, an ion implantation system is disclosed. The ion implantation system comprises a vacuum chamber that houses: extraction optics; a mass analyzer; a mass resolving device; and a workpiece holder; and an integrated gas box located in atmospheric conditions, the integrated gas box comprising an enclosure comprising a plurality of walls, wherein a wall of the plurality of walls includes an aperture, the enclosure containing one or more gas canisters and one or more power supplies; and a bushing affixed to the wall of the enclosure having the aperture, wherein an ion source is disposed within the bushing and a distal end of the bushing comprises a flange affixed to a wall of the vacuum chamber. In some embodiments, the ion source is insertable into the bushing via an interior of the enclosure. In some embodiments, the ion source creates a seal between the bushing and an interior of the enclosure, such that the ion source is at vacuum conditions. In some embodiments, the enclosure is biased at an enclosure voltage. In some embodiments, the enclosure comprises a first compartment; a second compartment to allow access to the bushing; and a third compartment. In certain embodiments, the one or more gas canisters and associated valves are disposed in the first compartment. In certain embodiments, the one or more power supplies are disposed in the third compartment. In certain embodiments, the second compartment also contains a rack to hold one or more of the one or more power supplies. In some embodiments, the ion source comprises an indirectly heated cathode ion source, having an arc chamber that contains an indirectly heated cathode, a filament disposed behind the indirectly heated cathode, and the one or more power supplies comprise a filament power supply to provide current to the filament, a cathode bias power supply to bias the indirectly heated cathode relative to the filament, and an arc power supply to bias the indirectly heated cathode relative to the arc chamber.

According to another embodiment, an integrated gas box for use with an ion implantation system is disclosed. The integrated gas box comprises an enclosure, having a plurality of walls, wherein the enclosure houses: one or more gas canisters and associated valves to provide gas to an ion source; and one or more power supplies to supply a respective voltage to a plurality of biased components; and wherein an aperture is disposed in a wall of the plurality of walls, and a bushing affixed to the wall having the aperture, such that an interior of the bushing is accessible through an interior of the enclosure, wherein the ion source is configured to be disposed in the bushing. In some embodiments, the enclosure is biased at an enclosure voltage, and wherein a ground reference of the one or more power supplies is the enclosure voltage. In some embodiments, the ion source comprises indirectly heated cathode ion source, having an arc chamber and an indirectly heated cathode. In certain embodiments, the arc chamber comprises a filament disposed behind the indirectly heated cathode, and the one or more power supplies comprise a filament power supply to provide current to the filament, a cathode bias power supply to bias the indirectly heated cathode relative to the filament, and an arc power supply to bias the indirectly heated cathode relative to the arc chamber. In some embodiments, the enclosure comprises a first compartment; a second compartment to allow access to the bushing; and a third compartment. In certain embodiments, the one or more gas canisters and associated valves are disposed in the first compartment. In certain embodiments, the one or more power supplies are disposed in the third compartment. In certain embodiments, the second compartment also contains a rack to hold one or more of the one or more power supplies. In certain embodiments, the third compartment is disposed above the second compartment and the first compartment is disposed below the second compartment.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
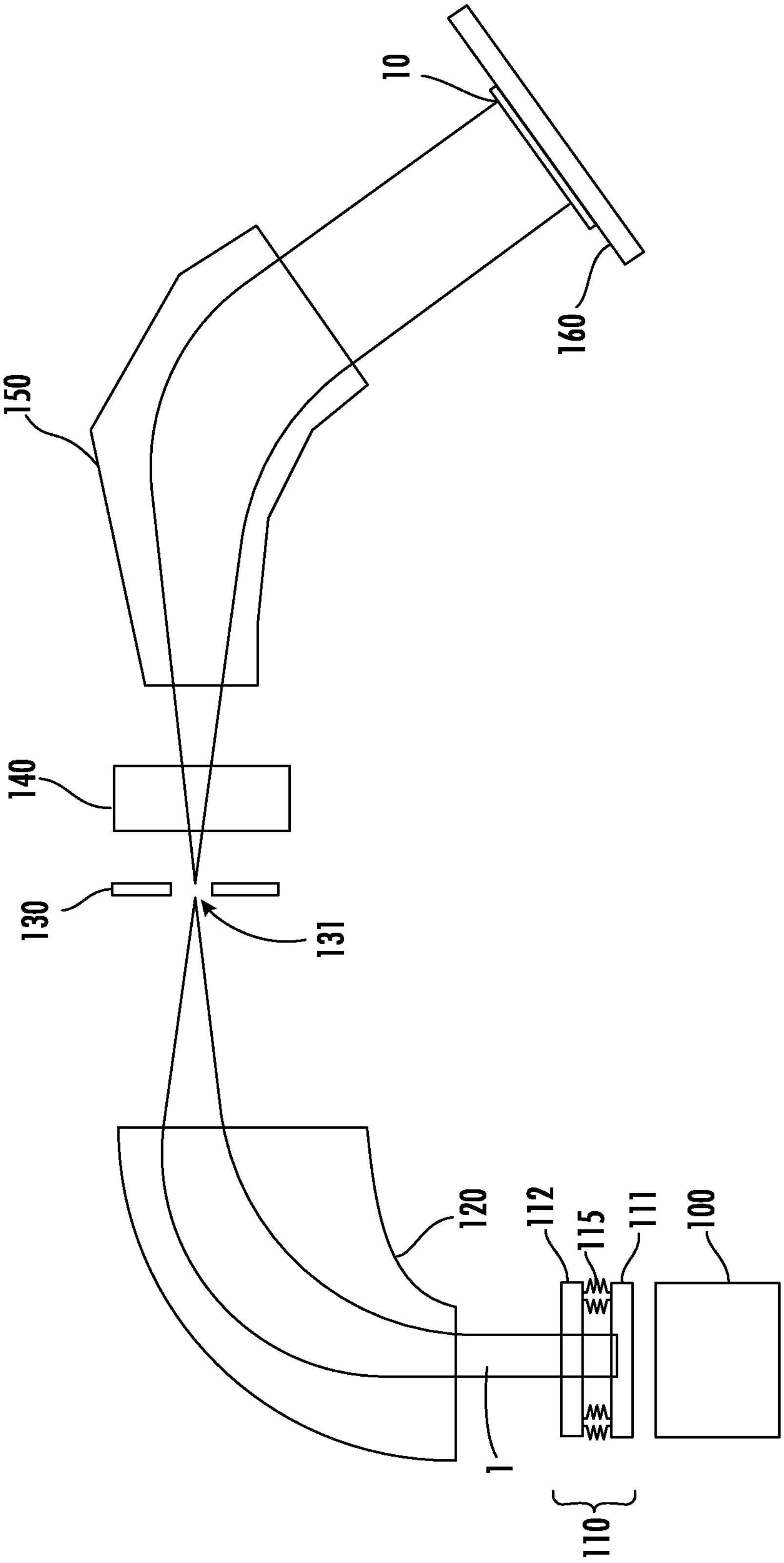
FIG. 1 is an ion implanter that utilizes the integrated gas box according to one embodiment.

FIG. 1 shows an ion implantation system that may be used for implanting ions into a workpiece using an ion beam according to one embodiment.

The ion implantation system includes an ion source 100 comprising a plurality of chamber walls defining an ion source chamber. In certain embodiments, the ion source 100 may be an IHC ion source. In this embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

In another embodiment, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHZ. Further, the power supplied by the RF power supply may be pulsed.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped.

Disposed outside and proximate the extraction aperture of the ion source 100 are extraction optics 110. In certain embodiments, the extraction optics 110 comprise one or more electrodes. In certain embodiments, the extraction optics 110 comprises a suppression electrode 111, which is negatively biased relative to the plasma so as to attract ions through the extraction aperture. The suppression electrode 111 may be electrically biased using a suppression power supply 290 (see FIG. 2). The suppression electrode 111 may be biased so as to be more negative than the extraction plate of the ion source 100. In certain embodiments, the suppression electrode 111 is negatively biased by the suppression power supply 290, such as at a voltage of between −3 kV and −15 kV.

In some embodiments, the extraction optics 110 includes a second electrode 112. The second electrode 112 may be disposed proximate the suppression electrode 111. The second electrode 112 may be electrically connected to a second electrode power supply 295 (see FIG. 2). In other embodiments, the second electrode 112 may be electrically grounded so that the second electrode power supply 295 is not used.

In other embodiments, the extraction optics 110 may comprise in excess of two electrodes, such as three electrodes or four electrodes. In these embodiments, the electrodes may be functionally and structurally similar to those described above, but may be biased at different voltages.

Each electrode in the extraction optics 110 may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the apertures in the extraction optics 110 are aligned such that the ions 1 pass through apertures.

The electrodes in the extraction optics 110 may be separated, both physically and electrically, through the use of one or more insulators 115. Further, in some embodiments, insulators are also used to separate the ion source 100 from the suppression electrode 111.

Located downstream from the extraction optics 110 is a mass analyzer 120. The mass analyzer 120 uses magnetic fields to guide the path of the extracted ions 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system.

A collimator 140 may be disposed downstream from the mass resolving device 130. The collimator 140 accepts the extracted ions 1 that pass through the resolving aperture 131 and creates a ribbon ion beam formed of a plurality of parallel or nearly parallel beamlets. In other embodiments, the ion beam may be a spot beam. In this embodiment, an electrostatic scanner is used to move the spot beam in the first direction, as defined below.

Located downstream from the collimator 140 may be an acceleration/deceleration stage 150. The acceleration/deceleration stage 150 may be an electrostatic filter. The electrostatic filter is a beam-line lens component configured to independently control deflection, deceleration, and focus of the ion beam. Located downstream from the acceleration/deceleration stage 150 is the workpiece holder 160.

In some embodiments, one or more lenses may be disposed along the beam line. A lens may be disposed before the mass analyzer 120, after the mass analyzer 120, before the collimator 140 or another suitable location.

The workpiece 10, which may be, for example, a silicon wafer, a silicon carbide wafer, or a gallium nitride wafer, is disposed on the workpiece holder 160.

In certain embodiments, the forward direction of the ion beam is referred to as the Z-direction, the direction perpendicular to this direction and horizontal may be referred to as the first direction or the X-direction, while the direction perpendicular to the Z-direction and vertical may be referred to as the second direction or Y-direction.

In some embodiments, the workpiece holder 160 is capable of moving in a direction that is perpendicular to the direction of the ion beam. Thus, in operation, the workpiece holder 160 moves in the second direction from a first position, which may be above the ion beam to a second position, which may be below the ion beam. The workpiece holder 160 then moves from the second position back to the first position. The ion beam is wider than the workpiece 10 in the first direction, ensuring that the entirety of the workpiece 10 is exposed to the ion beam.

Figure 2:
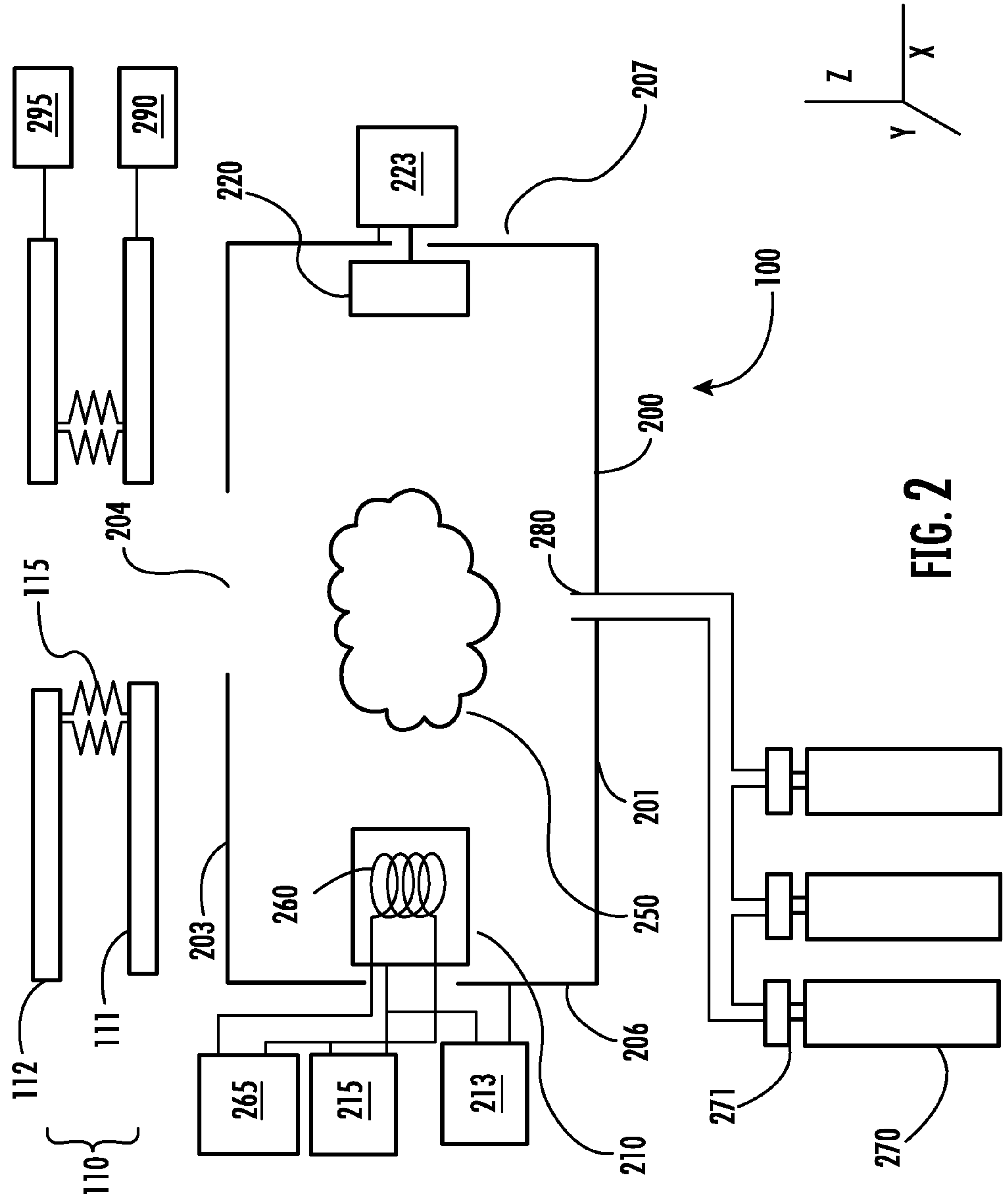
FIG. 2 show the components that are disposed in the integrated gas box according to one embodiment.

FIG. 2 shows an expanded view of the components related to the ion source 100. The ion source 100 includes an arc chamber 200, comprising two opposite ends, and walls 201 connecting to these ends. The walls 201 of the arc chamber 200 may be constructed of an electrically conductive material and may be in electrical communication with one another. In some embodiments, a liner may be disposed proximate one or more of the walls 201. A cathode 210 is disposed in the arc chamber 200 at a first end 206 of the arc chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into arc chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. In certain embodiments, the cathode 210 may be biased relative to the arc chamber 200, such as by arc power supply 213. In other embodiments, the cathode 210 may be electrically connected to the arc chamber 200, so as to be at the same voltage as the walls 201 of the arc chamber 200. In these embodiments, arc power supply 213 may not be employed and the cathode 210 may be electrically connected to the walls 201 of the arc chamber 200.

On the second end 207, which is opposite the first end 206, a repeller 220 may be disposed. The repeller 220 may be biased relative to the arc chamber 200 by means of a repeller bias power supply 223. In other embodiments, the repeller 220 may be electrically connected to the arc chamber 200, so as to be at the same voltage as the walls 201 of the arc chamber 200. In these embodiments, repeller bias power supply 223 may not be employed and the repeller 220 may be electrically connected to the walls 201 of the arc chamber 200. In another embodiment, the repeller 220 may be biased by means of the arc power supply 213. In still other embodiments, a repeller 220 is not employed.

The cathode 210 and the repeller 220 are each made of an electrically conductive material, such as a metal or graphite.

In certain embodiments, a magnetic field is generated in the arc chamber 200. This magnetic field is intended to confine the electrons along one direction. The magnetic field typically runs parallel to the walls 201 from the first end 206 to the second end 207. For example, electrons may be confined in a column that is parallel to the direction from the cathode 210 to the repeller 220 (i.e. the y direction). Thus, electrons do not experience any electromagnetic force to move in the y direction. However, movement of the electrons in other directions may experience an electromagnetic force.

Disposed on one side of the arc chamber 200, referred to as the extraction plate 203, may be an extraction aperture 204. In FIG. 2, the extraction aperture 204 is disposed on a side that is parallel to the X-Y plane (perpendicular to the page). A gas inlet 280 may be disposed on one wall of the arc chamber 200.

Further, the ion source 100 may be in communication with at least one gas canister. The gas canister 270 may contain a dopant gas, a halogen gas, an inert gas, or a diluent gas. In some embodiments, there are more than one gas canister 270.

A valve 271 may be utilized to control the flow of the gas from each of the gas canister 270 to the ion source 100.

As described above, the suppression electrode 111 is disposed proximate to the extraction aperture 204, outside of the ion source 100. In certain embodiments, insulators 115 are used to be physically electrically isolate the suppression electrode 111 from the extraction plate 203. Additional insulators 115 may be used to physically connect and electrically isolate the second electrode 112 from the suppression electrode 111.

To reduce the possibility of electromagnetic fields causing damage to the ion implantation system, many of the components shown in FIG. 2 are housed in a single enclosure.

Figure 3A:
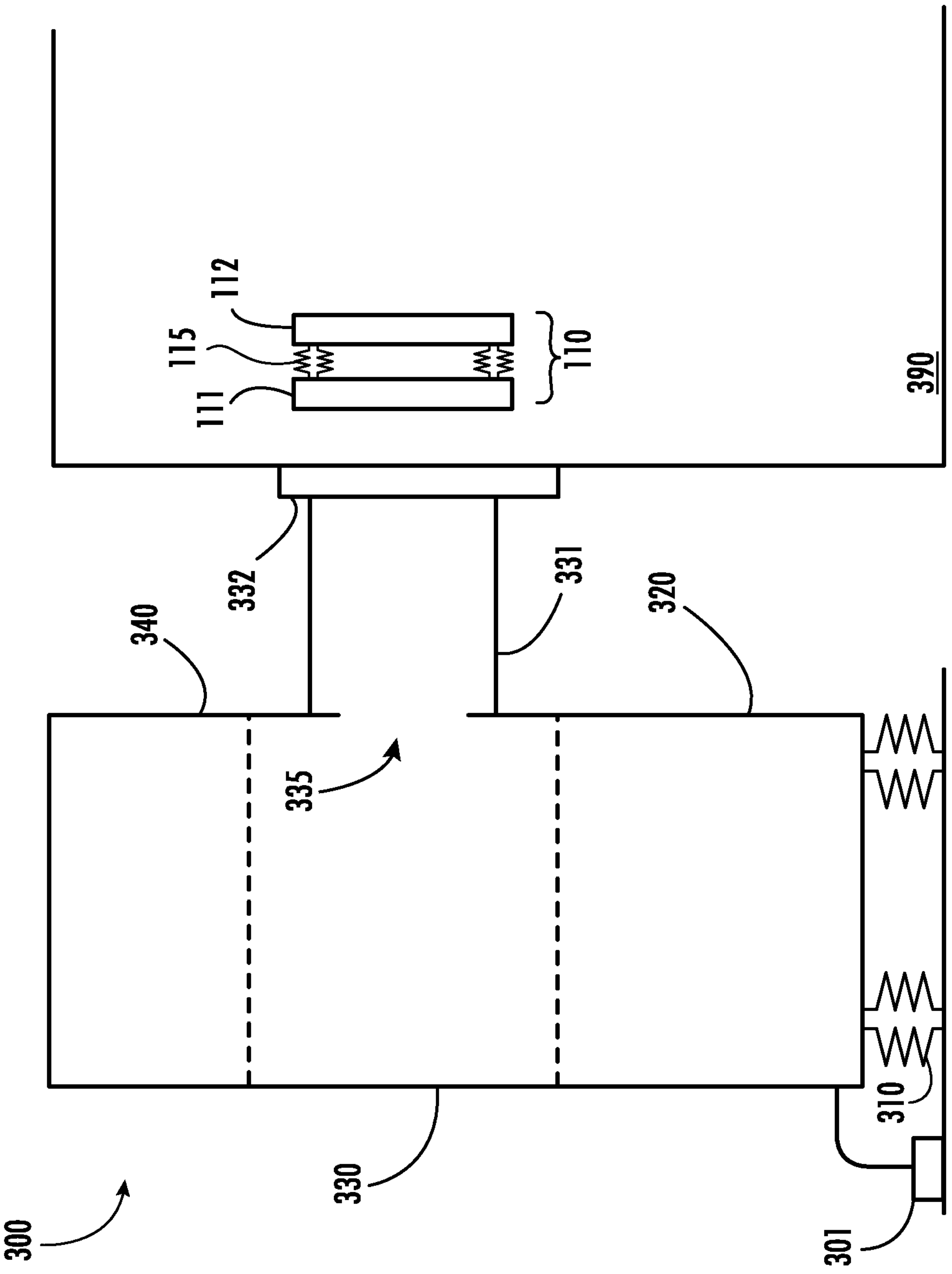
FIGS. 3A-3B show the general structure of an integrated gas box.
Figure 3B:
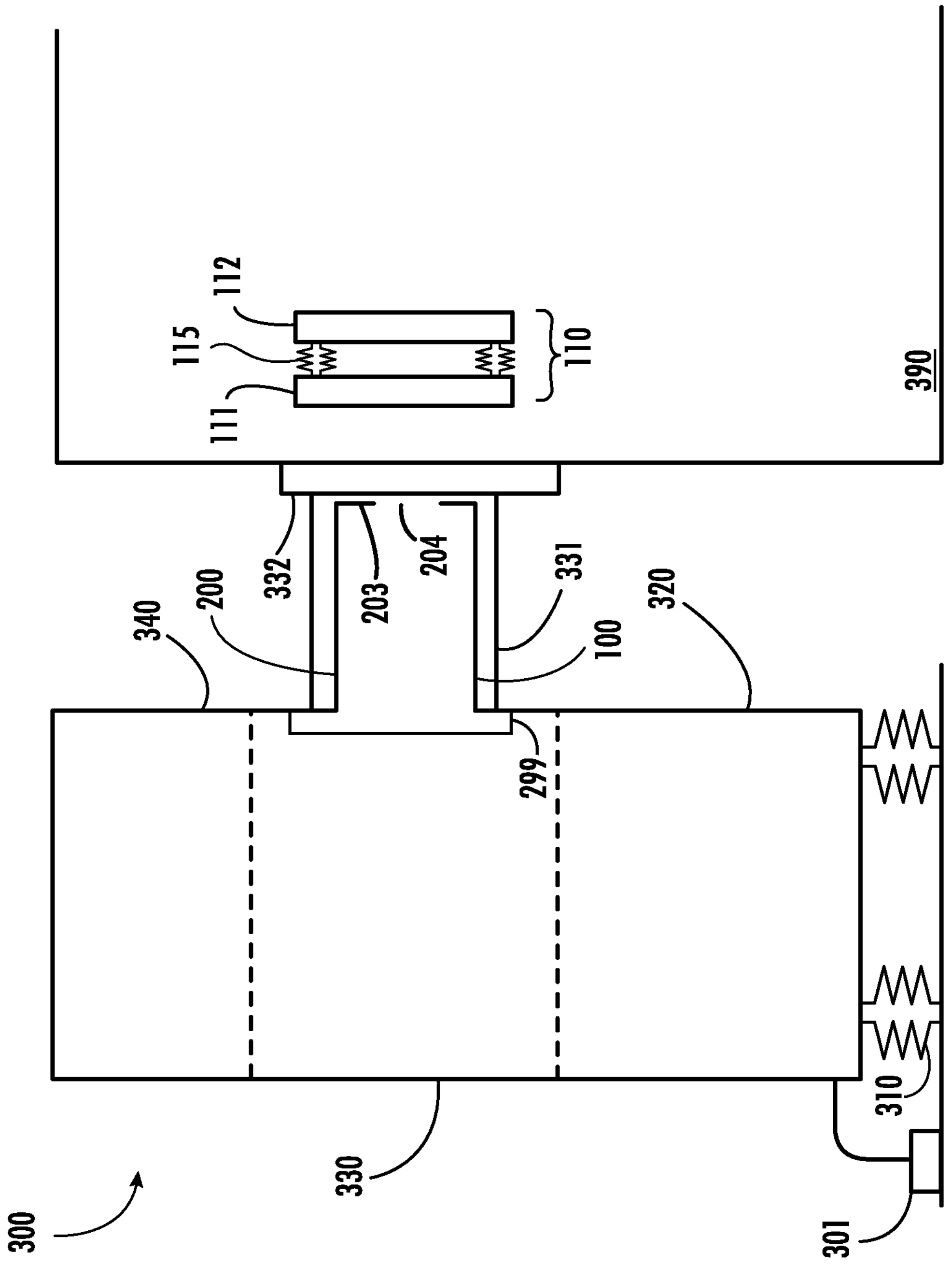
Figure 4:
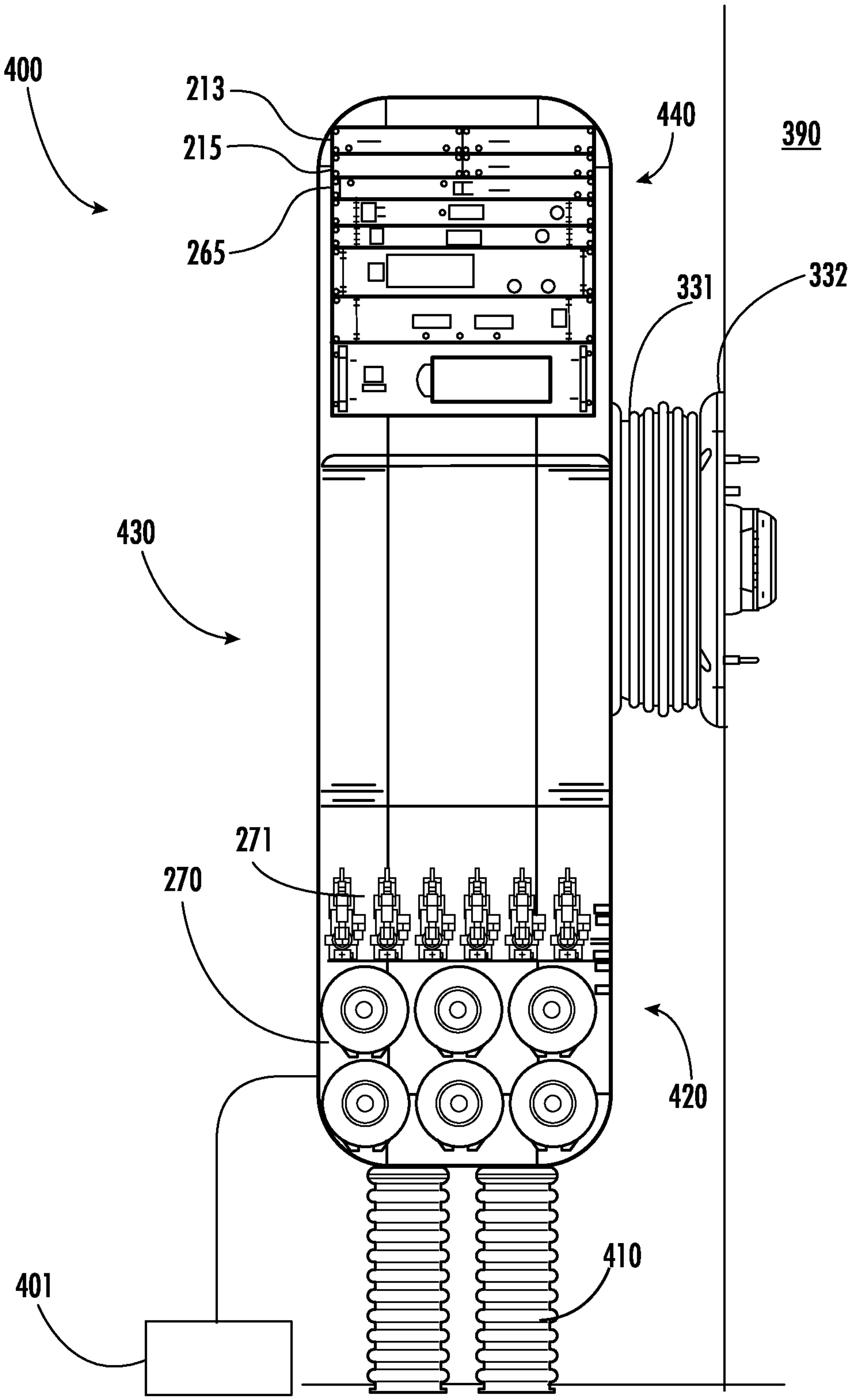
FIG. 4 shows the integrated gas box according to one embodiment.
Figure 5:
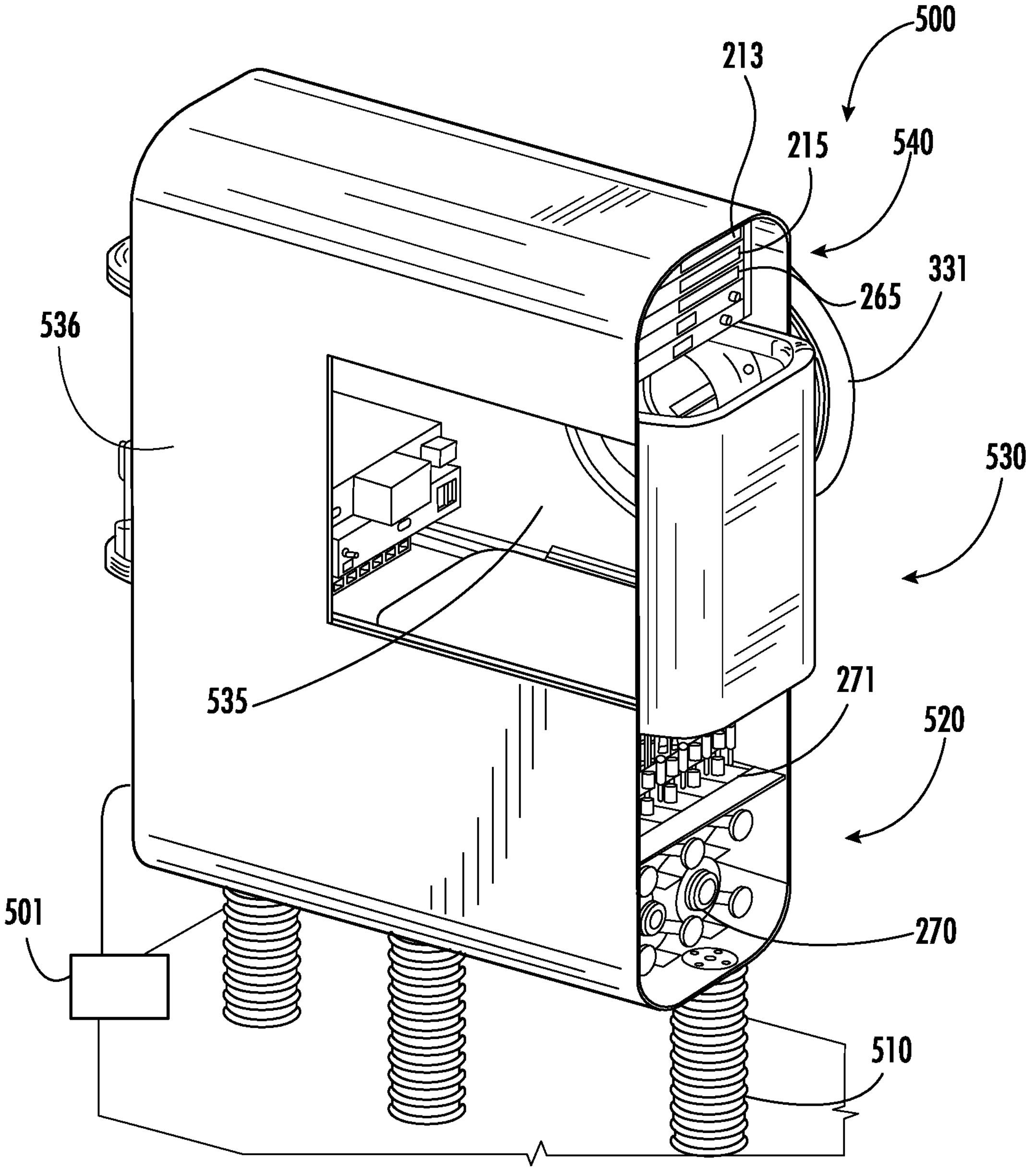
FIG. 5 shows the integrated gas box according to another embodiment.

FIGS. 3A-3B shows a diagram showing the general structure of the enclosure 300, also referred to as an integrated gas box, as it is incorporated into the ion implantation system. FIG. 3A shows the enclosure without the ion source 100 installed. FIG. 3B shows the enclosure 300 with the ion source installed. FIGS. 4 and 5 show two specific embodiments of the integrated gas box.

In the embodiments shown in FIGS. 3A-3B, the enclosure 300 is isolated from the ground using enclosure insulators 310. The enclosure 300 may be constructed from a conductive material. Further, the enclosure 300 may be biased to an enclosure voltage, which is different from earth ground, using an external enclosure power supply 301. The enclosure voltage may be more than 100 kV in some embodiments.

The enclosure 300 may be separated into three compartments, a first compartment 320, a second compartment 330 and a third compartment 340. Each of which is described in more detail below. In different embodiments, the dimensions and the functionality contained within the compartments may vary. In certain embodiments, the first compartment 320 may be below the second compartment 330 and the third compartment 340 may be above the second compartment 330.

The second compartment 330 includes a bushing 331 that extends outward from and is affixed to the exterior of one of the walls of the enclosure 300. The bushing 331 may be constructed from any insulating material with a high dielectric constant. For example, a specially formulated epoxy may be used to form the bushing 331. The wall of the enclosure 300 to which the bushing is affixed includes an aperture 335 so that the second compartment 330 allows access to the interior of the bushing 331. Thus, the interior of the bushing 331 may be accessed via the interior of the enclosure 300. The distal end of the bushing 331 includes a flange 332. The flange 332 is used to seal the bushing 331 to the vacuum chamber 390. The flange 332 covers an opening in a wall of the vacuum chamber 390, such that the interior of the bushing 331 is at vacuum conditions. The interior of the bushing 331 is hollow. As noted above, the interior of the bushing 331 may be accessed through the second compartment 330 because of the aperture 335 in the wall of the enclosure 300.

As seen in FIG. 3B, disposed in the interior of the bushing 331 is the ion source 100. Specifically, the arc chamber 200, the cathode 210, the repeller 220 and the filament 260 are disposed in the bushing 331. Other components, such as the gas canisters 270, valves 271 and power supplies are located in the enclosure 300.

The ion source 100 is oriented such that the extraction plate 203 is the wall of the arc chamber 200 that is located nearest the flange 332. In this way, ions are extracted through the extraction aperture 204 and travel through the flange 332 into the vacuum chamber 390. The extraction optics 110, which includes the suppression electrode 111 and the second electrode 112, are disposed within the vacuum chamber 390. The mass analyzer 120, the mass resolving device 130, the collimator 140, the acceleration/deceleration stage 150 and the workpiece holder 160 (see FIG. 1) are all located within the vacuum chamber 390. Thus, the flange 332 is used to seal the bushing 331 to the vacuum chamber 390 such that the interior of the arc chamber 200 is also maintained at near vacuum conditions.

In some embodiments, the ion source 100 is removably inserted into the bushing 331 and forms a seal with the wall of the enclosure 300. For example, the ion source 100 may include a base flange 299 located on its bottom wall, which is the wall that is opposite the extraction plate 203. The ion source 100 is slid into the bushing 331 through the aperture 335 (see FIG. 3A). The aperture 335 is dimensioned such that the base flange 299 cannot pass through the aperture 335 in the enclosure 300. Thus, the base flange 299 seals the ion source 100 to the enclosure 300. This base flange 299 also forms the boundary between the vacuum conditions in the vacuum chamber 390 and atmospheric conditions where the enclosure 300 is located. In other words, the enclosure 300 is disposed in an atmospheric environment, and only the ion source 100, which is disposed within the bushing 331, is at vacuum.

FIG. 4 shows one embodiment of this integrated gas box. In this embodiment, as described above, the enclosure 400 is isolated from the ground using enclosure insulators 410. The enclosure 400 may be constructed from a conductive material. Further, the enclosure 400 may be biased to an enclosure voltage, which is different from earth ground, using an external enclosure power supply 401. The enclosure voltage may be more than 100 kV in some embodiments.

As noted above, the enclosure 400 may be separated into three compartments, a first compartment 420, a second compartment 430 and a third compartment 440.

The second compartment 430 may be configured as described with respect to FIG. 3. The second compartment 430 is attached to the bushing 331, where the ion source 100 is located. The distal end of the bushing 331 includes a flange 332. As described above, an aperture in a wall of the enclosure 400 allows access to the interior of the bushing 331.

In certain embodiments, the first compartment 420 is used to house the gas canisters 270 and the associated valves 271. In certain embodiments, the enclosure 400 may have a depth such that gas canisters 270 may be laid on their side within the first compartment 420. In other words, the depth of the enclosure 400 is greater than the height of a gas canister 270. In some embodiments, the depth may be at least 30 inches. In addition, the width of the enclosure 400 may be such that three gas canisters 270 may be laid next to each other. In some embodiments, the width may be at least 20 inches. The height of the first compartment 420 may be such that at least two canisters 270, both laid on their sides, may be stacked on top of each other. Thus, in this embodiment, a total of six canisters 270 may be disposed in the first compartment 420, wherein all of the canisters 270 are on their side and there are three canisters 270 resting on three other canisters. In some embodiments, the valves 271 may all be disposed above the gas canisters 270. The input to each valve 271 is in communication with a respective gas canister 270. The outputs of the valves 271 may be joined together and enter the gas inlet 280 of the arc chamber 200.

The third compartment 440 may be used to house the power supplies associated with the ion source 100. For example, in certain embodiments, the filament power supply 265, the arc power supply 213 and the cathode bias power supply 215 may be disposed in the third compartment 440. These power supplies may be referenced the voltage applied to the enclosure 400. In other words, the ground reference of these power supplies may be the enclosure voltage supplied by external enclosure power supply 401. Although not shown, there may be additional power supplies that are disposed in the third compartment 440 and are similarly grounded. For example, the ion source 100 may utilize other power supplies, which may be located in the third compartment 440. In some embodiments, the third compartment 440 may be configured as a conventional 19 inch rack. Note that if the width of the enclosure is 20 inches or more, as described above, a standard 19 inch rack may be included in the third compartment 440. Thus, in these embodiments, the power supplies are each one or more rack units (RU) in height. In some embodiments, the height of the third compartment 440 may support up to 12 rack units (RU). Of course, other dimensions are also possible.

As noted above, the ion source 100 is disposed within the bushing 331. The second compartment 330 may include an access door or other mechanism to allow access to the interior of the enclosure and to the ion source 100, such as for purposes of preventative maintenance.

In certain embodiments, the first compartment 420 may be the lower compartment and the third compartment 440 may be the upper compartment. Further, the second compartment 430 may be disposed between the first compartment 420 and the third compartment 440 and may be a middle compartment. Thus, in this embodiment, the power supplies are all disposed above the second compartment 430 and all of the gas canisters 270 are disposed beneath the second compartment 430. The second compartment 430 is not populated. Rather, it is used to simply allow access to the ion source 100. Each compartment may include one or more access doors, to allow access to the interior of the respective compartment.

FIG. 5 shows another embodiment of an integrated gas box. In this embodiment, the depth of the enclosure 500 is increased. As described above, the enclosure 500 is isolated through the use of enclosure insulators 510. The enclosure 500 may be constructed of a conductive material and biased to an enclosure voltage, which is different from earth ground, using an enclosure power supply 501. The enclosure voltage may be more than 100 kV in some embodiments. In this embodiment, the depth of the enclosure 500 is such that it is greater than twice the height of a gas canister 270. The width of the enclosure 500 is as described above with respect to FIG. 4. Thus, in this configuration, there may be as many as 12 gas canisters 270 located in the first compartment 520, assuming that two gas canisters may be laid on each other in the vertical direction. As described above, the valves 271 associated with each gas canister 270 may be located above the gas canisters 270 in the first compartment 520.

Further, the third compartment 540 may support standard 19 inch rack mounted power supplies, as described above. However, the number of rack units in the third compartment 540 may be reduced, as compared to the embodiment in FIG. 4. For example, the third compartment 540 may only support 6 or fewer rack units.

The second compartment 530 in this embodiment differs than that described in FIG. 4. In this embodiment, the second compartment 530 is partitioned in the depth direction to form a first portion 535 and a second portion 536. Similar to the embodiment of FIG. 4, the first portion 535 is used to allow access to the ion source 100, located in the bushing 331. Thus, the bushing 331 is accessed via an aperture in the first portion 535 of the second compartment 530.

The second portion 536 may be configured as a traditional 19 inch rack, and may support 6 rack units or more. In this way, one or more of the power supplies may be disposed in the second portion 536, while other power supplies are disposed in the third compartment 540. In another embodiment, the height of the second compartment 530 may be such that the third compartment 540 may be eliminated. As described above, the power supplies contained within the enclosure 500 may use the enclosure voltage applied by the enclosure power supply 501 as the ground reference.

The embodiments described above in the present application may have many advantages. As the voltage applied to the ion source increases, the likelihood of an arcing event also increases. These arcing events create electromagnetic fields that can induce a current on signal lines. If the induced current is significant enough, it may permanently damage the components in communication with those signal lines, causing extended periods of down time. By incorporating the power supplies and gas canisters into the same enclosure that houses the ion source, the risk of this induced current is reduced. This may help improve the availability of the ion implantation system.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
a vacuum chamber that houses:
extraction optics;
a mass analyzer;
a mass resolving device; and
a workpiece holder; and
an integrated gas box located in atmospheric conditions, the integrated gas box comprising an enclosure comprising a plurality of walls, wherein a wall of the plurality of walls includes an aperture, the enclosure containing one or more gas canisters and one or more power supplies; and
a bushing affixed to the wall of the enclosure having the aperture, wherein an ion source is disposed within the bushing and a distal end of the bushing comprises a flange affixed to a wall of the vacuum chamber.

2. The ion implantation system of claim 1, wherein the ion source is insertable into the bushing via an interior of the enclosure.

3. The ion implantation system of claim 1, wherein the ion source creates a seal between the bushing and an interior of the enclosure, such that the ion source is at vacuum conditions.

4. The ion implantation system of claim 1, wherein the enclosure is biased at an enclosure voltage.

5. The ion implantation system of claim 1, wherein the enclosure comprises:
a first compartment;
a second compartment to allow access to the bushing; and
a third compartment.

6. The ion implantation system of claim 5, wherein the one or more gas canisters and associated valves are disposed in the first compartment.

7. The ion implantation system of claim 5, wherein the one or more power supplies are disposed in the third compartment.

8. The ion implantation system of claim 5, wherein the second compartment also contains a rack to hold one or more of the one or more power supplies.

9. The ion implantation system of claim 1, wherein the ion source comprises an indirectly heated cathode ion source, having an arc chamber that contains an indirectly heated cathode, a filament disposed behind the indirectly heated cathode, and the one or more power supplies comprise a filament power supply to provide current to the filament, a cathode bias power supply to bias the indirectly heated cathode relative to the filament, and an arc power supply to bias the indirectly heated cathode relative to the arc chamber.

10. An integrated gas box for use with an ion implantation system, comprising:
an enclosure, having a plurality of walls, wherein the enclosure houses:
one or more gas canisters and associated valves to provide gas to an ion source; and
one or more power supplies to supply a respective voltage to a plurality of biased components; and
wherein an aperture is disposed in a wall of the plurality of walls, and a bushing affixed to the wall having the aperture, such that an interior of the bushing is accessible through an interior of the enclosure, wherein the ion source is configured to be disposed in the bushing.

11. The integrated gas box of claim 10, wherein the enclosure is biased at an enclosure voltage, and wherein a ground reference of the one or more power supplies is the enclosure voltage.

12. The integrated gas box of claim 10, wherein the ion source comprises an indirectly heated cathode ion source, having an arc chamber and an indirectly heated cathode.

13. The integrated gas box of claim 12, wherein the arc chamber comprises a filament disposed behind the indirectly heated cathode, and the one or more power supplies comprise a filament power supply to provide current to the filament, a cathode bias power supply to bias the indirectly heated cathode relative to the filament, and an arc power supply to bias the indirectly heated cathode relative to the arc chamber.

14. The integrated gas box of claim 10, wherein the enclosure comprises:

a first compartment;

a second compartment to allow access to the bushing; and a third compartment.

15. The integrated gas box of claim 14, wherein the one or more gas canisters and associated valves are disposed in the first compartment.

16. The integrated gas box of claim 15, wherein the one or more power supplies are disposed in the third compartment.

17. The integrated gas box of claim 16, wherein the second compartment also contains a rack to hold at least one of the one or more power supplies.

18. The integrated gas box of claim 17, wherein the third compartment is disposed above the second compartment and the first compartment is disposed below the second compartment.

* * * * *